US012390880B2

(12) United States Patent
Jochheim et al.

(10) Patent No.: US 12,390,880 B2
(45) Date of Patent: Aug. 19, 2025

(54) METHOD FOR OPERATING AN ULTRASONIC CONNECTING DEVICE

(71) Applicant: HESSE GmbH, Paderborn (DE)

(72) Inventors: Andreas Jochheim, Paderborn (DE);
Matthias Hunstig, Paderborn (DE);
Michael Broekelmann, Delbrueck (DE)

(73) Assignee: Hesse GmbH, Paderborn (DE)

( * ) Notice: Subject to any disclaimer, the term of this patent is extended or adjusted under 35 U.S.C. 154(b) by 0 days.

(21) Appl. No.: 18/226,046

(22) Filed: Jul. 25, 2023

(65) Prior Publication Data
US 2023/0364703 A1 Nov. 16, 2023

Related U.S. Application Data

(63) Continuation of application No. PCT/DE2021/101019, filed on Dec. 20, 2021.

(30) Foreign Application Priority Data

Jan. 26, 2021 (DE) .................... 10 2021 101 654.1

(51) Int. Cl.
*B23K 20/00* (2006.01)
*B23K 20/10* (2006.01)
*B23K 101/38* (2006.01)

(52) U.S. Cl.
CPC .......... *B23K 20/10* (2013.01); *B23K 2101/38* (2018.08)

(58) Field of Classification Search
CPC ...... B23K 20/10; B23K 20/26; B23K 31/125; B06B 2201/72; B06B 3/00; H01L 2224/85205; H01L 2224/859; H01R 43/0207
See application file for complete search history.

(56) References Cited

U.S. PATENT DOCUMENTS

| 4,571,688 | A | | 2/1986 | Kashihara et al. |
| 4,597,519 | A | | 7/1986 | Kurtz et al. |
| 4,631,685 | A | * | 12/1986 | Peter ................. B29C 66/81419 425/29 |
| 8,302,840 | B2 | | 11/2012 | Qin et al. |
| 10,466,204 | B2 | * | 11/2019 | Kawamoto ............ G01N 29/04 |
| 2019/0084078 | A1 | * | 3/2019 | Kunigami .......... H01R 43/0207 |
| 2019/0131752 | A1 | * | 5/2019 | Kunigami ................ H05K 3/36 |
| 2019/0139929 | A1 | * | 5/2019 | Lee ......................... H01L 24/85 |

(Continued)

FOREIGN PATENT DOCUMENTS

| DE | 102019118249 A1 | 1/2021 |
| WO | WO2008140541 A1 | 11/2008 |

OTHER PUBLICATIONS

International Search Report dated May 17, 2022 in corresponding application PCT/DE2021/101019.

(Continued)

*Primary Examiner* — Erin B Saad
(74) *Attorney, Agent, or Firm* — Muncy, Geissler, Olds & Lowe, P.C.

(57) ABSTRACT

A method for operating an ultrasonic bonding apparatus, the ultrasonic bonding apparatus providing an ultrasonic transducer with a carrier, displaceable in a z direction, including an ultrasound generating device which is movable relative to the carrier and is held thereon, and including an ultrasonic tool which is excitable to ultrasonic vibrations by the ultrasound generating device.

15 Claims, 4 Drawing Sheets

(56) References Cited

U.S. PATENT DOCUMENTS

| | | | |
|---|---|---|---|
| 2019/0314925 A1* | 10/2019 | Schultz | G01P 15/122 |
| 2020/0035642 A1* | 1/2020 | Egusa | B06B 3/00 |
| 2021/0005571 A1 | 1/2021 | Seidl et al. | |
| 2022/0105693 A1* | 4/2022 | Aizawa | B29C 66/9511 |

OTHER PUBLICATIONS

International Preliminary Report on Patentability dated Aug. 10, 2023 in corresponding application PCT/DE2021/101019.

\* cited by examiner

METHOD FOR OPERATING AN ULTRASONIC CONNECTING DEVICE

This nonprovisional application is a continuation of International Application No. PCT/DE2021/101019, which was filed on Dec. 20, 2021, and which claims priority to German Patent Application No. 10 2021 101 654.1, which was filed in Germany on Jan. 26, 2021, and which are both herein incorporated by reference.

BACKGROUND OF THE INVENTION

Field of the Invention

The invention relates to an operating method for an ultrasonic bonding apparatus as well as the use of the method for electrically contacting components of the power electronic system.

Description of the Background Art

Known methods for bonding electrically conductive components by means of ultrasound frequently provide that the components to be bonded are placed next to each other and pressed against each other. At least one component is then excited to vibrations in the ultrasonic range with the aid of an ultrasonic tool, with the result that a materially bonded connection forms between the component. The quality of the electrical bond established in this manner is determined to a great extent by the vibration parameters, in particular the frequency and vibration amplitude as well as the process force with which the components are pressed against each other during the establishment of the bond.

Depending on the constitution and configuration of the components as well as the bonding system provided for establishing the electrically conductive bond of the components, the components to be bonded may initially not abut each other or contact each other directly. For example, if a connection conductor, in particular a load current connection conductor designed with a comparatively thick cross section, needs to be connected to a power electronic assembly, the connection conductor is first positioned above a bonding region of the power electronic assembly. Due to manufacturing tolerances, a gap of unknown size typically forms between the connection conductor and the bonding region. Only when the ultrasonic tool is lowered is the connection conductor pressed against a connecting surface of the bonding region by the ultrasonic tool and elastically deformed. A portion of a bonding force applied via the ultrasonic tool is therefore needed to deform the connection conductor even before the materially bonded connection is established.

To ensure that the ultrasonic bond is reliably established within a short period of time and with a uniformly high quality, precise knowledge and monitoring of the process parameters are important. For example, to be able to ascertain the process time within which the ultrasound is active, it must be known when the gap between the connection conductor and the bonding region is closed, and the two components touch each other. In addition, the knowledge of the time curve of the process force active between the components makes it possible to influence the bonding process and to monitor it in such a way that the quality of the ultrasonic bond may be inferred from the process parameters.

SUMMARY OF THE INVENTION

It is therefore an object of the present invention to provide an improved operating method for an ultrasonic bonding apparatus.

To achieve the object, the invention provides a method for operating an ultrasonic bonding apparatus, which provides an ultrasound head with a carrier, displaceable in a z direction, an ultrasound generating device held on the carrier and movable relative thereto, and an ultrasonic tool which may be excited to ultrasonic vibrations by the ultrasound generating device, comprises the following steps: an electrically conductive connection conductor is positioned above an electrically conductive bonding region provided on a bonding component in such a way that a gap having a determined clearance in the z direction is formed between the connection conductor, on the one hand, and a connecting surface of the bonding region facing the connection conductor, on the other hand; the ultrasound head is positioned relative to the connection conductor and the bonding component above the connection conductor in such a way that a contact surface of the ultrasonic tool designed for contact with the connection conductor faces the connection conductor; a bonding force active in the z direction is applied to the ultrasound generating device, which is pressed against the carrier; the ultrasound head is then lowered in the z direction, a displacement position of the ultrasound head in the z direction as well as a determined relative position of the ultrasonic generating device to the carrier in the z direction are ascertained, and a contact point in time at which the connection conductor is lowered by the ultrasonic tool in such a way that it touches the bonding region of the bonding component is ascertained from the displacement position of the ultrasound head and the relative position of the ultrasound generating device to the carrier.

An advantage of the invention is that the knowledge of the contact point in time makes it possible to determine the process duration, while the energy introduced into the bonding site by the ultrasonic vibrations contributes to the materially bonded connection of the connection conductor and the bonding component. The bonding process may thus be carried out precisely and controlled or monitored, with the result that the materially bonded connection may be securely established or bonding errors detected. Additional safety measures relating to the process duration may be avoided or reduced, so that the throughput is ultimately increased and the economic feasibility of the method improved.

The contact point in time can be determined in that a difference is ascertained between a temporal change in the displacement position of the ultrasound head and the relative position of the ultrasound generating device to the carrier, and a zero value for the difference is then detected. If the temporal change in the displacement position, on the one hand, and the relative position, on the other hand, are the same size, the ultrasound generating device moves away from the carrier at the same velocity at which the ultrasound head is lowered. This is then the case if the connection conductor is placed against the connecting surface of the bonding region and does not yet itself undergo any deformation.

A process force active between the connection conductor and the bonding component can be determined for the contact point in time from the bonding force, on the one hand, and a supporting force, with the aid of which the ultrasound generating device is pressed against the carrier, or a closing force applied to close the gap between the connection conductor and the bonding component, on the other hand. In particular, the process force is determined as the difference between the bonding force and the supporting force or the closing force. The bonding process may advantageously be influenced or monitored in an even more targeted manner with knowledge of the process force. Not only may the application of a minimum process force be ensured but also the process engineering mapping of a process time curve which has proven to be favorable for the special bonding task. For example, special material parameters for the connection conductor, its cross-sectional shape, or its diameter may be taken into account here.

For example, the supporting force between the ultrasound detection device and the carrier may be captured by sensors. The closing force may be determined, for example, as the bonding force at the contact point in time.

The method according to the invention can be used, for example, to bond a load current connection conductor to a connecting component of a power electronic assembly. Due to the comparatively high currents, the connection conductors used for this purpose have a comparatively large cross section, so that classic bonding methods, in which the connection conductor is fed continuously via the ultrasound head, reach their limits. Instead, the connection conductor is cut to length or preshaped and handled separately. It is then brought into position in such a way that it is provided above the bonding region, and the gap of unknown size forms between the connection conductor and the bonding region.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

An ultrasonic bonding apparatus suitable for carrying out the method according to the invention comprises an ultrasound head 1, which is displaceable in a z direction. Ultrasound head 1 provides a carrier 2 as well as an ultrasound generating device 3, which is movable relative to carrier 2 and is held thereon. An ultrasonic tool 4, which, in the present case, extends longitudinally in the z direction and tapers in a wedge-shaped manner on a free end facing away from ultrasound generating device 3, is fixed to ultrasound generating device 3. Ultrasound generating device 3 comprises, for example, piezoceramic elements or converters, which excite ultrasonic tool 4 to mechanical vibrations in the ultrasonic range as a result of electrical input signals.

Figure 1:
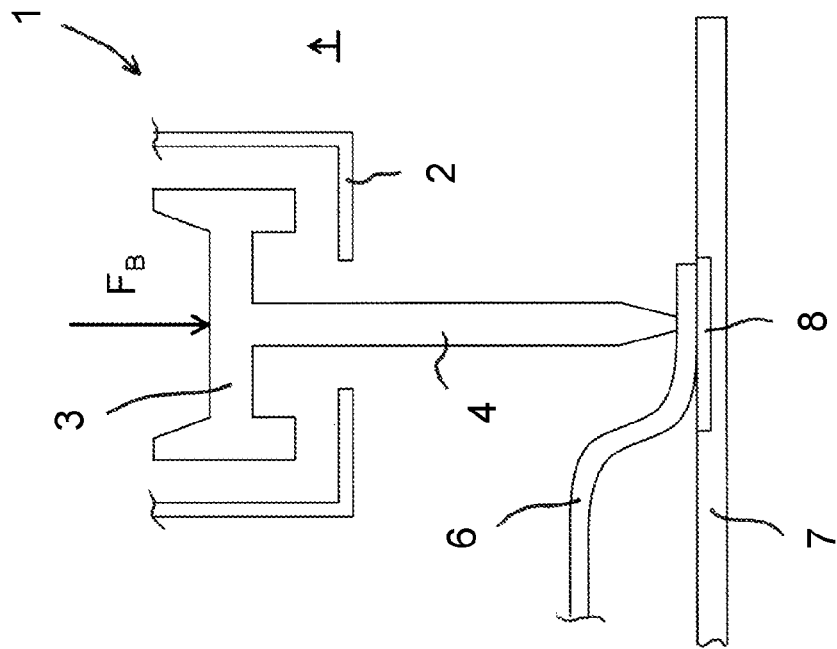
FIG. 1 shows a schematic diagram of an ultrasound head of an ultrasonic bonding apparatus prior to establishing an ultrasonic bond.

In an initial configuration according to FIG. 1, ultrasound head 1 is provided above an electrically conductive bonding region 8 formed on a bonding component 7. A connection conductor 6 is positioned between a contact surface 5 of ultrasonic tool 4, which faces bonding region 8, and bonding region 8. Connection conductor 6 is, for example, a load current connection conductor, which is connected in a materially bonded manner to bonding region 8 of bonding component 7 with the aid of the ultrasonic bonding apparatus. A connecting surface 9 of bonding region 8 faces connection conductor 6.

In the initial configuration, connection conductor 6 is positioned at a distance from bonding component 7 so that a gap 10 having a clearance s extending in the z direction is formed between bonding region 8 of bonding component 7 and connection conductor 6. Connection conductor 6 is furthermore provided at a distance from ultrasonic tool 4.

Figure 2:
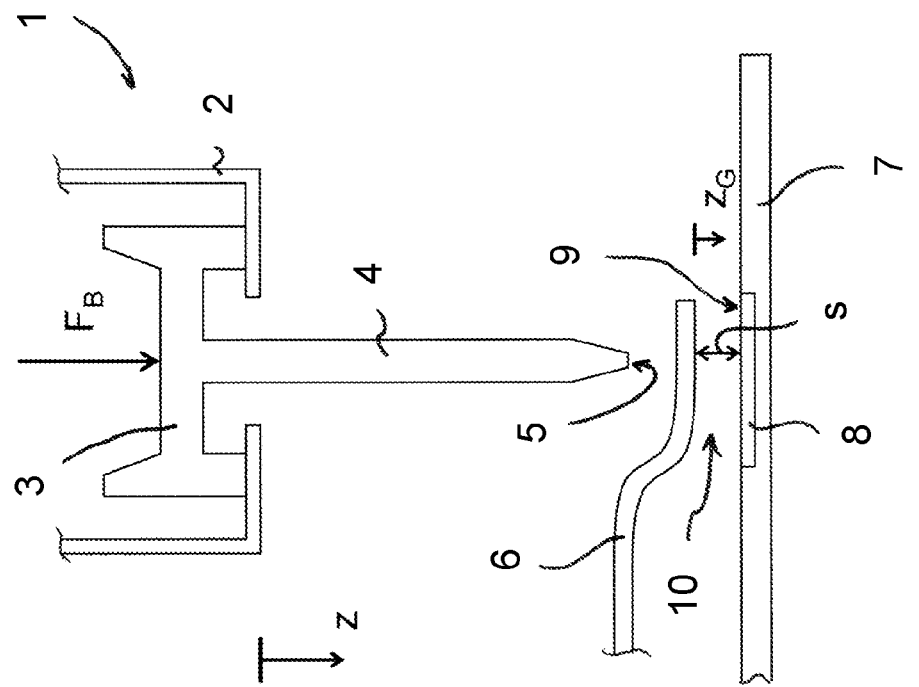
FIG. 2 shows the ultrasound head of the ultrasonic bonding apparatus according to FIG. 1 during the manufacturing of the ultrasonic bonding apparatus.

FIG. 2 shows the ultrasonic bonding apparatus during the establishment of the ultrasonic bond. It is such that connection conductor 6 is now pressed against connecting surface 9 of bonding region 8 by ultrasonic tool 4, which is placed with contact surface 5 on connection conductor 6. Ultrasonic tool 4 is excited to vibrations by ultrasound generating device 3, and a bonding force $F_B$ is applied thereto in the z direction. Ultrasound head 1 is displaced or lowered in the z direction until ultrasound generating device 3 is provided at a distance from carrier 2.

Figure 3:
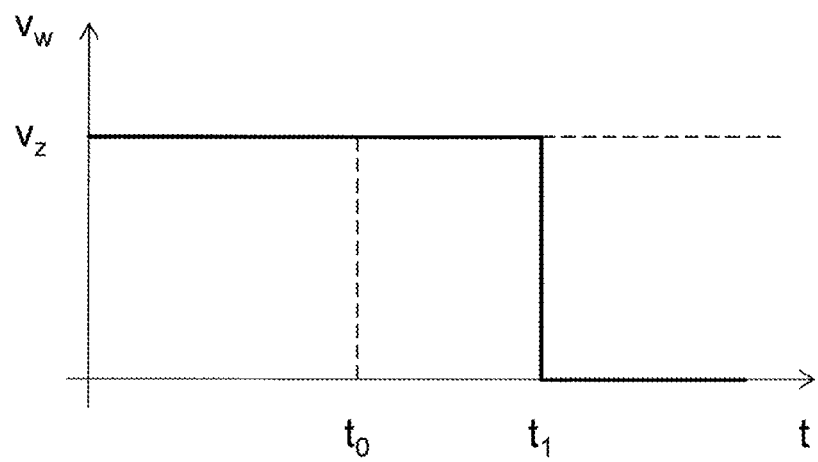
FIG. 3 shows various velocity/time curves during the establishment of the ultrasonic bond for a first bonding case.
Figure 3:
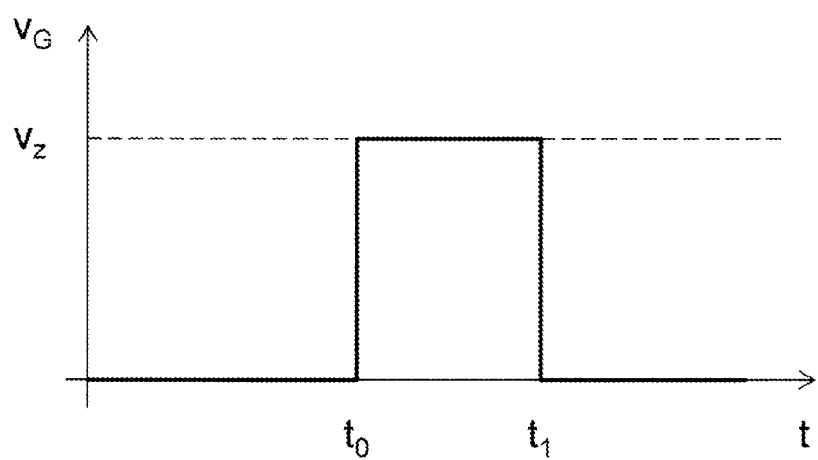
Figure 3:
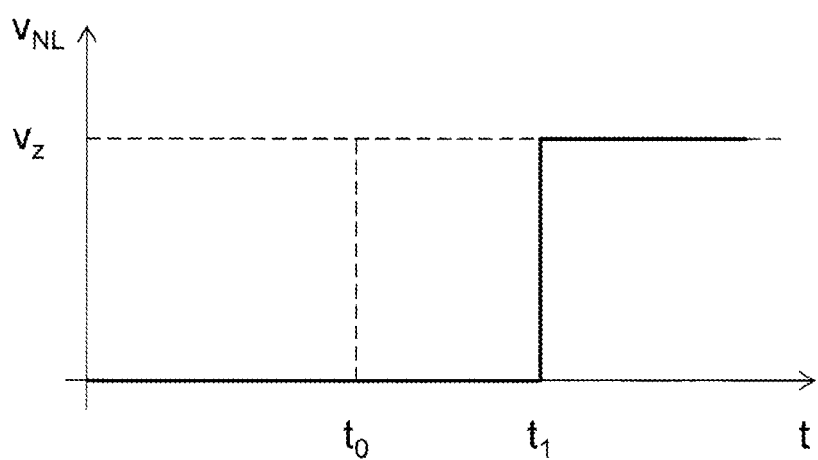
Figure 4:
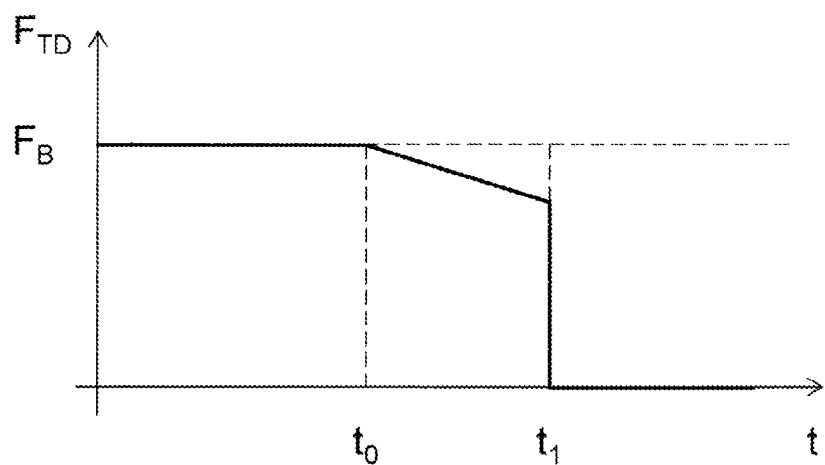
FIG. 4 shows various force/time curves for the first bonding case.
Figure 4:
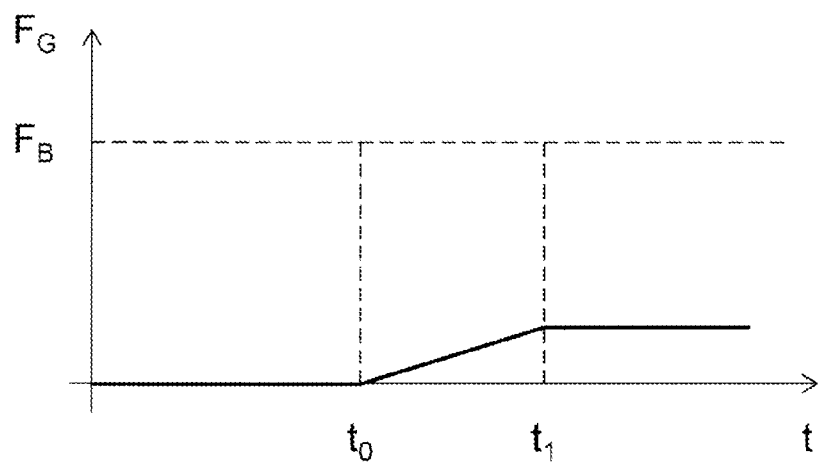
Figure 4:
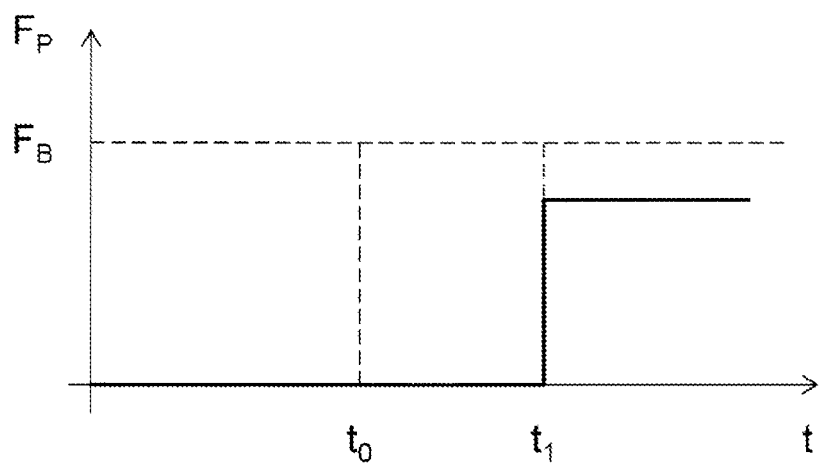

The functioning of the operating method according to the invention is explained below for a first bonding case with reference to FIGS. 1 and 2, based on the velocity and force time curves in FIGS. 3 and 4.

Based on the configuration according to FIG. 1, ultrasound head 1 is lowered in the z direction. Due to the lowering, a contact between contact surface 5 of ultrasonic tool 4 and connection conductor 6 is first formed at a transport point in time $t_0$. Connection conductor 6, which is elastically deformable, is transported by ultrasonic tool 4 and descends in the direction of connecting surface 9 of bonding region 8. A touching between connection conductor 6 and bonding region 8 then forms for the first time at a contact point in time $t_1$.

For bonding case 1, it is assumed that applied bonding force $F_B$ is greater than a closing force $F_G$ to be applied for closing gap 10. Bonding force $F_B$ is constant, while closing force $F_G$ increases linearly with a deflection $z_G$ of connection conductor 6 from the resting position illustrated in FIG. 1. Closing force $F_G$ is therefore variable over time. It is determined by the following formula:

$$F_G(t) = c_G \cdot z_G(t)$$

$c_G$ may be understood as the unknown spring constant of connection conductor 6.

It is further assumed that ultrasound head 1 is lowered slowly and at constant velocity $v_z$ in the z direction. Velocity $v_z$ is time derivation $\dot{z}$ of a displacement position z of ultrasound head 1 in the z direction. A quasi-stationary process is assumed for the explanation below. It is also assumed that the components of ultrasound head 1, including ultrasonic tool 4 as well as the substrates are ideally rigid. The changes in velocity at transport point in time $t_0$ and at contact point in time $t_1$ may be seen as being abrupt.

If ultrasound head 1 is lowered in the z direction, displacement position z of ultrasound head 1 changes at assumed constant velocity $v_z = \dot{z}$. Since it is assumed for the first bonding case that bonding force $F_B$ is greater than closing force $F_G$, a velocity $v_w$ of ultrasonic tool 4 in the z direction corresponds to velocity $v_z$ of ultrasound head 1. A relative movement between holder 2 and ultrasound generating device 3, on which ultrasonic tool 4 is held, does not result up until the closing of gap 10. Once gap 10 is closed at contact point in time $t_1$, ultrasonic tool 4 stops.

If one alternatively considers the deformation of connection conductor 6, the latter remains stationary until transport point in time $t_0$. Like deformation velocity $v_G$, its deflection $z_G$ is zero up to transport point in time $t_0$. Starting at transport point in time $t_0$, gap 10 is closed at a velocity $$v_G = \dot{z}_G = v_z.$$

At contact point in time $t_1$, connection conductor 6 abuts connecting surface 9 of bonding region 8. Starting at this point in time, its velocity $v_G$ is zero, just like velocity $v_w$ of ultrasonic tool 4.

Starting at contact point in time $t_1$, ultrasound generating device 3 will detach from carrier 2, due to the further lowering of ultrasound head 1 in the z direction. A relative position $z_{NL}$ between carrier 2 and ultrasound generating device 3 may thus be determined metrologically. Velocity $v_{NL} = \dot{z}_{NL}$, at which ultrasound generating device 3 moves away from carrier 2, corresponds to velocity $v_z$, at which ultrasound head 1 is lowered in the z direction. A difference $\Delta v$ of zero therefore results starting at contact point in time $t_1$. With the aid of the method according to the invention, it is therefore possible to determine contact point in time $t_1$ from the velocity difference $$\Delta v(t) = v_z(t) - v_{NL}(t).$$

The ultrasonic bonding apparatus provides suitable measuring means for this purpose, for example position sensors.

Since spring constant $c_G$ of connection conductor 6 is unknown, closing force Fe may not be determined from displacement position z of ultrasound head 1 at contact point in time $t_1$. Instead, supporting force $F_{TD}$ is measured, with which ultrasound generating device 3 is pressed against carrier 2. The ultrasound generating device may be provided with suitable measuring means for this purpose, for example force sensors. Process force $F_P$ after the positioning then corresponds to supporting force $F_{TD}$ at point in time $t_1$—immediately prior to the positioning. Associated closing force $F_G$ at point in time $t_1$, which may be calculated by $$F_G(t_1) = F_B - F_{TD}(t_1-)$$

may then be taken into account during the establishment of the electrically conductive, materially bonded connection between connection conductor 6 and bonding setup 7, since the following applies to process force $F_P$ $$F_P = F_B - F_G(t_1).$$

For the second bonding case, it is assumed that closing force $F_G$ is greater than the force initially applied to ultrasound head 1 in the z direction. The initially active force is to be understood below as bonding basic force component $F_{B0}$.

If bonding basic force component $F_{B0}$ is lower than closing force $F_G$ which must be applied to close gap 10, ultrasound generating device 3, which is movable relative to carrier 2 and is held thereon, detaches from carrier 2 even before gap 10 is completely closed. In addition to bonding basic force component $F_{B0}$, a bond path force component is applied, which, together with bonding basic force component $F_{B0}$, defines bonding force $F_B$ active in the z direction.

It is assumed that the bond path force component is described by a linear spring characteristic $c_B \cdot z_{NL}(t)$. In this case, $c_B$ defines a known or experimentally determinable machine constant of the ultrasonic bonding apparatus, which is defined, for example, by the elasticity in the suspension of ultrasound generating device 3 on carrier 2.

If one now considers the bonding force predefined by the ultrasonic bonding apparatus, $$F_B(t) = F_{B0} + c_B \cdot z_{NL}(t),$$

bonding force $F_B$ in the second bonding case increases linearly as a function of relative position $z_{NL}$ between carrier 2 and ultrasound generating device 3, gap 10 steadily reliably closing up to contact point in time $t_1$.

At any point in time during the closing operation, the force equilibrium $$F_G(t) = F_B(t)$$

or $$c_G \cdot z_G(t) = F_{B0} + c_B \cdot z_{NL}(t)$$

applies, and, by deriving the velocity ratio during the pressing down of connection conductor 6, the following also applies:

$$c_G \cdot v_G = c_B \cdot v_{NL}.$$

The sum of the velocities yields velocity $v_z$, at which ultrasound head 1 is lowered:

$$v_z = v_G + v_{NL},$$

so that the velocities are distributed to $$v_w = c_B / (c_G + c_B) \cdot v_z \text{ and}$$

$$v_{NL} = c_G / (c_G + c_B) \cdot v_z.$$

Figure 5:
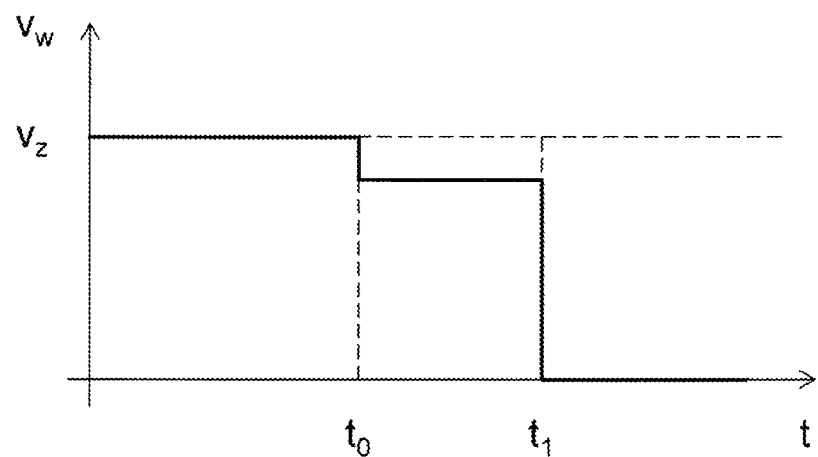
FIG. 5 shows various velocity/time curves during the manufacturing of the bonding system for a second bonding case.
Figure 5:
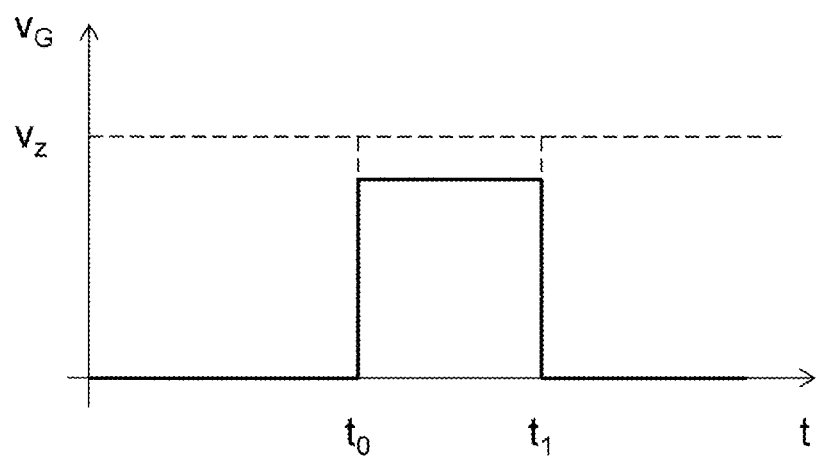
Figure 5:
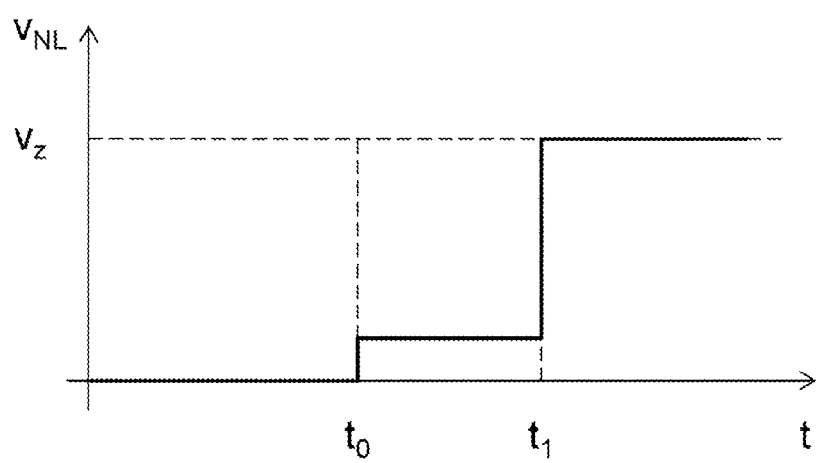

The velocity curves with the distribution of the velocity between points in time $t_0$ and $t_1$ are illustrated in FIG. 5. To simplify, it has been assumed here that $F_{B0} = 0$. The exact curve of velocities $v_w$, $v_{NL}$ in the closing phase, which is constant in the present exemplary embodiment, is not important. Instead, the fact that contact point in time $t_1$ may be detected again due to difference $\Delta v$ between the temporal change in displacement position z and relative position $z_{NL}$ is relevant, which results in zero:

$$\Delta v(t) = v_z(t) - v_{NL}(t) = \dot{z}(t) - \dot{z}_{NL}(t) = 0$$

In addition, closing force $F_G$ at contact point in time $t_1$ may be determined as follows without additional force sensors:

$$F_G = F_{B0} + c_B \cdot z_{NL}(t_1).$$

Process force $F_P$, which is active between connection conductor 6 and bonding component 7 during the establishment of the ultrasonic bond, may therefore be ascertained from the difference between bonding force $F_B$ and closing force $F_G$ at contact point in time $t_1$:

$$F_P = F_B - F_G(t_1).$$

In the present exemplary embodiment of the operating method according to the invention, it is assumed as an example that ultrasound generating device 3 is held on carrier 2 in a manner relatively movable thereto via elastic connecting elements. The force applied as a result of the deflection (relative position $z_{NL}$) was derived by taking into account machine constant $c_B$. It is also possible that the force active between carrier 2 and ultrasound generating device 3 does not depend linearly on relative position $z_{NL}$ and/or is determined as a function of time or velocity. Moreover, ultrasound generating device 3 may be fastened to carrier 2 via an actuator, so that the bond path force component may be set or determined in a variable manner.

Identical components and component functions are identified by the same reference numerals.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating an ultrasonic bonding apparatus, the ultrasonic bonding apparatus comprising an ultrasound head that is displaceable in a z direction, the ultrasound head having a carrier, an ultrasound generating device held on the carrier and movable relative thereto, and an ultrasonic tool fixed to the ultrasound generating device to be excited to ultrasonic vibrations by the ultrasound generating device, the method comprising:

positioning an electrically conductive connection conductor above an electrically conductive bonding region provided on a bonding component such that a gap having a determined clearance in the z direction is formed between the connection conductor and a connecting surface of the bonding region facing the connection conductor;

positioning the ultrasound head relative to the connection conductor and the bonding component such that a contact surface of the ultrasonic tool, designed for contact with the connection conductor, faces the connection conductor;

applying a bonding force, active in the z direction, to the ultrasound generating device to press the ultrasound generating device against the carrier;

and subsequently lowering the ultrasound head in the z direction, and determining a displacement position of the ultrasound head in the z direction as well as a relative position of the ultrasound generating device with respect to the carrier in the z direction; and taking into account the displacement position and the relative position, a contact point in time is determined at which the connection conductor is lowered so far by the ultrasonic tool so as to touch the bonding region of the bonding component.

2. The method according to claim 1, wherein the contact point in time is determined by determining a difference between a temporal change in the displacement position and the relative position and detecting a zero value for the difference.

3. The method according to claim 1, wherein the bonding force is determined as a function of the relative position of the ultrasound generating device with respect to the carrier and comprises a bond path force component dependent on the relative position of the ultrasound generating device with respect to the carrier.

4. The method according to claim 3, wherein the bonding force is additively derived from a bonding basic force component applied to the ultrasound head and the bond path force component.

5. The method according to claim 4, wherein a known and linear dependency is present between the bonding force and/or the bond path force component and the relative position of the ultrasound generating device with respect to the carrier.

6. The method according to claim 3, wherein the bond path force component is applied and/or settable by an actuator.

7. The method according to claim 1, wherein the ultrasound generating device is pressed against the carrier by a supporting force, the supporting force being determined for the contact point in time.

8. The method according to claim 7, wherein the supporting force is measured at the contact point in time and/or continuously.

9. The method according to claim 4, wherein a closing force is determined for the contact point in time, which is applied to close the gap between the connection conductor and the bonding component.

10. The method according to claim 9, wherein the closing force is determined as a sum of a bonding basic force component and the bond path force component at the contact point in time.

11. The method according to claim 7, wherein a process force active between the connection conductor and the bonding component, during an establishment of an ultrasonic bond between the connection conductor and the bonding component, is determined from the bonding force and the supporting force and/or a closing force determined for the contact point in time, the closing force being applied to close the gap between the connection conductor and the bonding component.

12. The method according to claim 11, wherein the process force is determined as a difference between the bonding force and the closing force.

13. The method according to claim 1, wherein the relative position and/or the displacement position is/are detected by measuring.

14. The method according to claim 1, wherein after the contact point in time, the ultrasound generating device is activated so that the ultrasonic tool is excited to ultrasonic vibrations.

15. The method according to claim 1, wherein the ultrasonic bonding apparatus is provided to electrically conductively bond the connection conductor to the bonding region of the bonding component, wherein the bonding component is a power electronics assembly.

* * * * *